US008426226B2

(12) United States Patent  
Chyi et al.

(10) Patent No.: US 8,426,226 B2
(45) Date of Patent: Apr. 23, 2013

(54) METHOD FOR FABRICATING INTEGRATED ALTERNATING-CURRENT LIGHT-EMITTING-DIODE MODULE

(75) Inventors: Jen-Inn Chyi, Taoyuan (TW); Geng-Yen Lee, Taoyuan (TW); Wei-Sheng Lin, Taoyuan (TW)

(73) Assignee: National Central University, Jung-Ii, Taoyuan (TW)

( * ) Notice: Subject to any disclaimer, the term of this patent is extended or adjusted under 35 U.S.C. 154(b) by 0 days.

(21) Appl. No.: 13/342,431

(22) Filed: Jan. 3, 2012

(65) Prior Publication Data

US 2013/0034919 A1    Feb. 7, 2013

(30) Foreign Application Priority Data

Aug. 4, 2011   (TW) .............................. 100127680 A

(51) Int. Cl.
*H01L 21/00*    (2006.01)

(52) U.S. Cl.
USPC ................... 438/23; 257/79; 257/82; 257/83; 257/84; 257/88; 257/89; 257/99; 257/E21.499; 257/E27.12; 257/E29.325; 257/E33.066; 315/192; 315/253; 315/294; 362/249.06; 363/126; 438/29

(58) Field of Classification Search ..................... 257/79, 257/82–84, 88, 89, 99, E21.499, E27.12, 257/E29.325, E33.066; 315/192, 253, 294; 362/249.06; 363/126; 438/23, 28

See application file for complete search history.

(56) References Cited

U.S. PATENT DOCUMENTS

| 7,531,843 | B2 | 5/2009 | Lin et al. | |
|---|---|---|---|---|
| 8,294,174 | B2 * | 10/2012 | Chen et al. | 257/99 |
| 2007/0284606 | A1 * | 12/2007 | Sugimori | 257/99 |
| 2011/0059559 | A1 | 3/2011 | Yen et al. | |
| 2011/0062891 | A1 * | 3/2011 | Chen et al. | 315/294 |
| 2011/0074305 | A1 * | 3/2011 | Yeh et al. | 315/253 |
| 2012/0049213 | A1 * | 3/2012 | Chen et al. | 257/89 |

FOREIGN PATENT DOCUMENTS

TW    201104911 A    2/2011

* cited by examiner

*Primary Examiner* — Asok K Sarkar
(74) *Attorney, Agent, or Firm* — Muncy, Geissler, Olds & Lowe, PLLC

(57) ABSTRACT

A method for fabricating an integrated AC LED module comprises steps: forming a junction layer on a substrate, and defining a first growth area and a second growth area on the junction layer; respectively growing a Schottky diode and a LED on the first growth area and the second growth area; forming a passivation layer and a metallic layer on the Schottky diode, the LED and the substrate. Thereby, the Schottky diode is electrically connected with the LED via the metallic layer. Thus is promoted the reliability of electric connection of diodes, reduced the layout area of the module, and decreased the fabrication cost.

13 Claims, 10 Drawing Sheets

METHOD FOR FABRICATING INTEGRATED ALTERNATING-CURRENT LIGHT-EMITTING-DIODE MODULE

FIELD OF THE INVENTION

The present invention relates to an AC LED module, particularly to a method for fabricating an AC LED module through integrating Schottky diodes and LEDs.

BACKGROUND OF THE INVENTION

Because of durability, lightweight and power efficiency, LED (Light Emitting Diode) has been massively applied to various optoelectronic products, such as indicators, illuminators and displays. Traditionally, LED is driven by DC (Direct Current) power. However, the power source available in the daily life environment is AC (Alternating Current) power. Thus, LED needs to be driven by an AC-DC converter and a step-down transformer, which increase the fabrication cost. Further, energy is wasted when AC is converted into DC.

A U.S. Pat. No. 7,531,843 disclosed a LED structure with an AC circuit, wherein the opposite electrodes of at least two LEDs are connected in parallel, and wherein the LEDs are driven by AC to emit light alternatingly according to the electric connection thereof Such a design indeed makes LEDs able to emit light under AC. However, every LED chip can only emit light at one of the semi-cycles of AC. Thus, only one half of LEDs operate at any moment of AC application, and there are always another half of LEDs idle and wasted.

An R.O.C. Pub. No. 201104911 disclosed a LED illumination device, which integrates a plurality of LEDs and a plurality of rectifier elements (Schottky diodes) to form a Wheatstone bridge-like structure, whereby every LED emits light in the complete cycle of AC, whereby is increased the use rate of LEDs, and whereby is promoted uniformity of illumination. However, the LEDs and rectifier elements are integrated in a wire-bonding method, which not only raises the fabrication cost but also increases the layout area of the device. Besides, the wire-bonding process may decrease the reliability of the device.

A U.S. Pub. No. 20110059559 disclosed an AC light emitting device and a method for fabricating the same, wherein a plurality of light emitting elements are formed on a substrate, and wherein a rectifier-dedicated region is formed on the surface of a portion of the light emitting elements, and wherein rectifier elements are formed on the rectifier-dedicated region, and wherein at least four rectifier elements are arranged to form a Wheatstone bridge functioning as a rectification unit, whereby every LED emits light in the complete cycle of AC, and whereby the rectifier elements have higher inverse bias resistance and lower turn-on voltage. However, in the prior art, the rectifier-dedicated layer is fabricated on the light emitting elements with an epitaxial method or a deposition method after the light emitting element has been fabricated. Next, an etching method is used to define the rectifier elements and the light emitting elements. Such a fabrication process is likely to damage the surface of the light emitting elements, degrade the electric performance of the light emitting elements and lower the light efficiency of the light emitting elements.

SUMMARY OF THE INVENTION

The primary objective of the present invention is to solve the conventional problem that the wire-bonding process for integrating rectifier elements and LEDs not only increases fabrication cost and layout area but also results in poor reliability.

Another objective of the present invention is to solve the conventional problem that the re-etch process is likely to damage the surface of LEDs and decrease the light efficiency of LEDs when the rectifier elements and LEDs are grown on an identical substrate.

To achieve the abovementioned objectives, the present invention proposes a method for fabricating an integrated AC LED module, which comprises steps:

providing a substrate and a junction layer on the substrate, wherein at least one first growth area, at least one second growth area, and at least one non-growth area between the first and second growth areas are defined on the surface of the junction layer;

respectively forming a Schottky diode and a LED on the first growth area and the second growth area, and respectively defining a first electric connection area and a second electric connection area on the Schottky diode and the LED;

removing the non-growth area of the junction layer until the substrate is exposed in order to separate the first growth area and the second growth area by a gap;

forming a passivation layer on a portion of the substrate, the Schottky diode and the LED, wherein the portion of the substrate is the area corresponding to the non-growth area, and wherein the first and second electric connection areas are exposed; and forming a metallic layer on the passivation area, the first electric connection area and the second electric connection area so as to electrically connect the Schottky diode with the LED via the metallic layer.

In one embodiment, the Schottky diode is formed on the junction layer firstly in the step of forming the Schottky diode and the LED. Next, the Schottky diode respectively on the second growth area and the non-growth area is removed. Then, the LED is grown on the second growth area.

In another embodiment, the LED is formed on the junction layer firstly in the step of forming the Schottky diode and the LED. Next, the LED respectively on the first growth area and the non-growth area is removed. Then, the Schottky diode is grown on the first growth area.

The present invention respectively grows the Schottky diode and the LED on the first growth area and the second growth area, which are separated by a gap, to overcome the conventional problem of damaged LED surface and downgraded light efficiency resulting from using an etching process to separate the overlapped Schottky diode and LED. The present invention further forms a metallic layer to electrically connect the Schottky diode with the LED, whereby is decreased layout area, increased reliability of electric connection, and reduced fabrication cost.

DETAILED DESCRIPTION OF THE PREFERRED EMBODIMENTS

The technical contents of the present invention are described in detail in cooperation with the drawings below.

Figure 1:
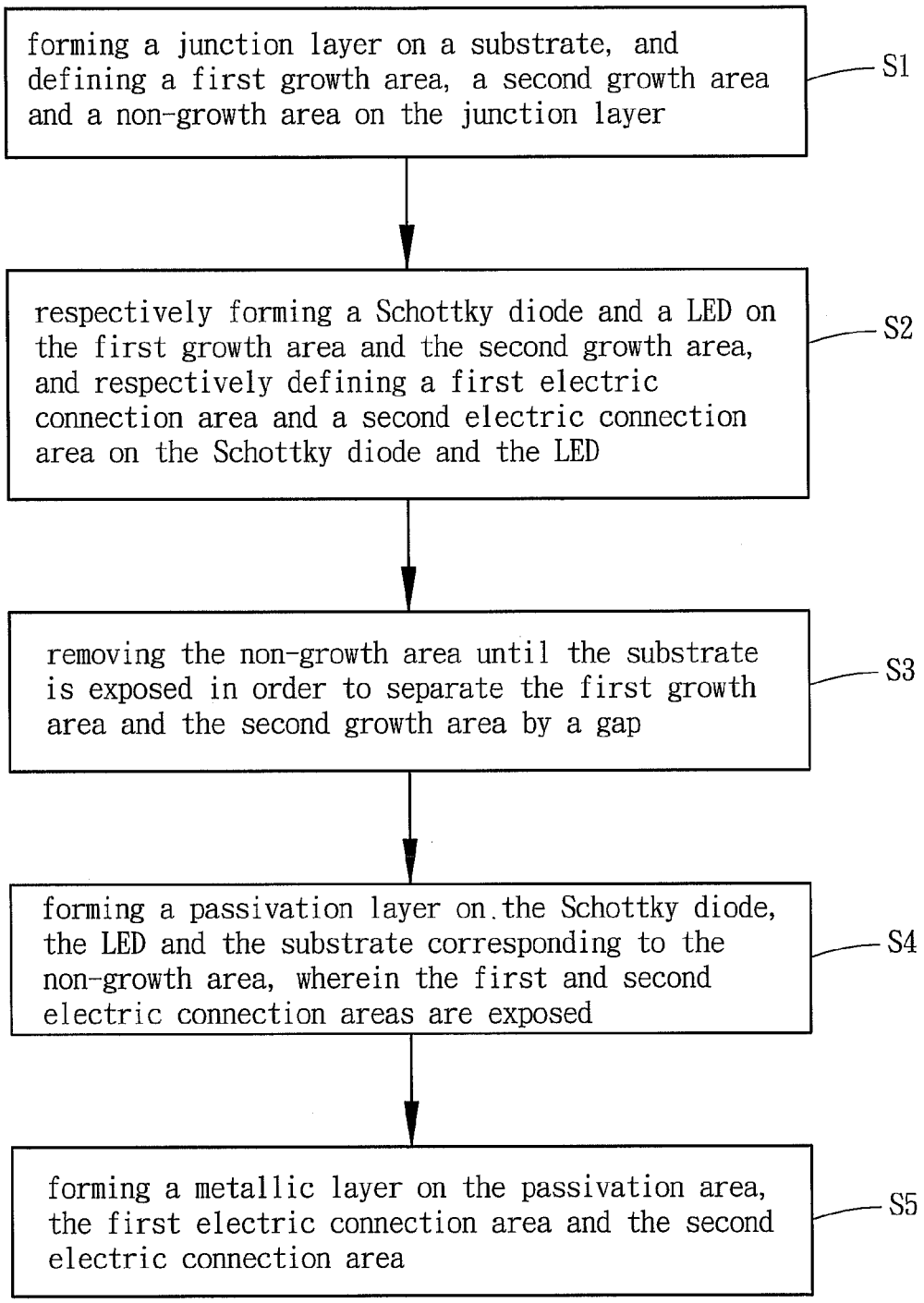
FIG. 1 shows a flowchart of a method for fabricating an integrated AC LED module according to one embodiment of the present invention.

Refer to FIG. 1 and FIGS. 2A-2J. FIG. 1 shows a flowchart of a method for fabricating an integrated AC LED module according to one embodiment of the present invention. FIGS. 2A-2J are sectional views schematically showing the process to fabricate an integrated AC LED module according to one embodiment of the present invention. The present invention comprises the following steps.

Step S1: provide a substrate 10 and a junction layer 11 on the substrate 10; define on the junction layer 11 at least one first growth area 111, at least one second growth area 112, and at least one non-growth area 113 between the first and second growth areas 111 and 112.

Step S2: respectively grow Schottky diodes 20 and LEDs 30 on the first growth areas 111 and the second growth areas 112; respectively define first electric connection areas 21 and second electric connection areas 31 on the surfaces of the Schottky diodes 20 and the LEDs 30.

Step S3: remove the non-growth area 113 of the junction layer 11 until the substrate 10 is exposed, whereby the first growth area 111 and the second growth area 112 are separated by a gap d.

Step S4: form a passivation layer 40 on the Schottky diodes 20, the LEDs 30 and the substrate 10 corresponding to the non-growth areas 113 with first electric connection areas 21 and the second electric connection areas 31 being exposed.

Step S5: form a metallic layer 50 on the passivation layer 40, the first electric connection areas 21 and the second electric connection areas 31, whereby the metallic layer 50 electrically connect the Schottky diodes 20 and the LEDs 30.

Figure 2A:
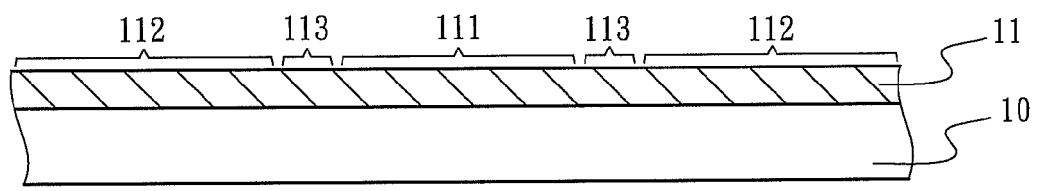
FIGS. 2A-2J schematically show the process to fabricate an integrated AC LED module according to one embodiment of the present invention.

Refer to FIGS. 2A-2J sectional views schematically showing the process to fabricate an integrated AC LED module according to one embodiment of the present invention. As shown in FIG. 2A, grow a junction layer 11 on a substrate 10, and define a first growth area 111, a second growth area 112 and a non-growth area 113 on the junction layer 11, wherein the non-growth area 113 is located between the first and second growth areas 111 and 112. The substrate 10 is made of a material selected from a group consisting of sapphire, silicon, silicon carbide, and gallium nitride. The junction layer 11 is made of a material selected from a group consisting of gallium nitride, aluminum indium gallium nitride, and magnesium zinc oxide. In one embodiment, an N-type gallium nitride junction layer 11 is grown on a sapphire substrate 10.

Figure 2B:
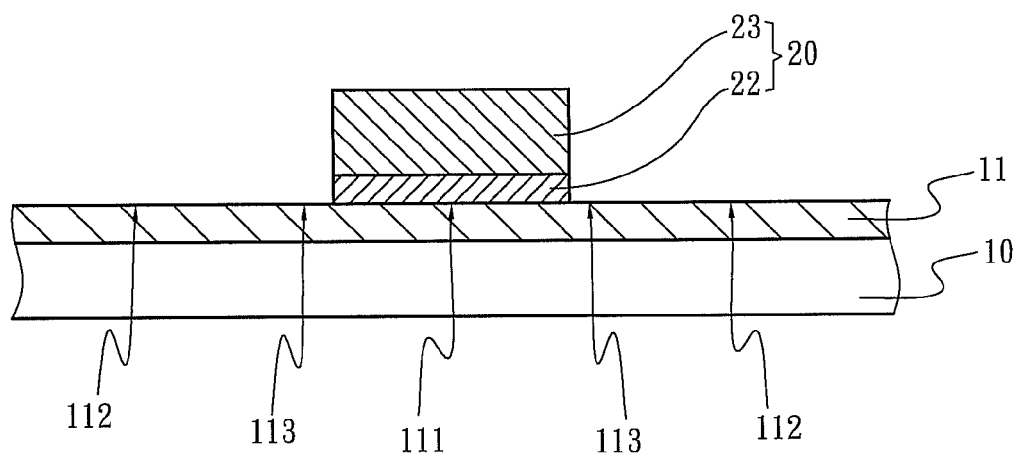

As shown in FIG. 2B, grow a Schottky diode 20 on the junction layer 11 by an MOCVD (Metalorganic Chemical Vapor Deposition) method. Next, use a photolithographic technology to etch off the Schottky diode 20 on the second growth area 112 until the junction layer 11 is exposed. The Schottky diode 20 includes a buffer layer 22 and an active layer 23. The buffer layer 22 contacts the junction layer 11 and is located between the junction layer 11 and the active layer 23. The buffer layer 22 is made of a material selected from a group consisting of gallium nitride, aluminum nitride, indium nitride, and combinations thereof. The active layer 23 is made of a material selected from a group consisting of gallium nitride, aluminum indium gallium nitride, and magnesium zinc oxide. In one embodiment, the Schottky diode 20 contains an aluminum gallium nitride/aluminum nitride dual-layer buffer layer 22 and a gallium nitride/aluminum gallium nitride/gallium nitride triple-layer active layer 23.

Figure 2C:
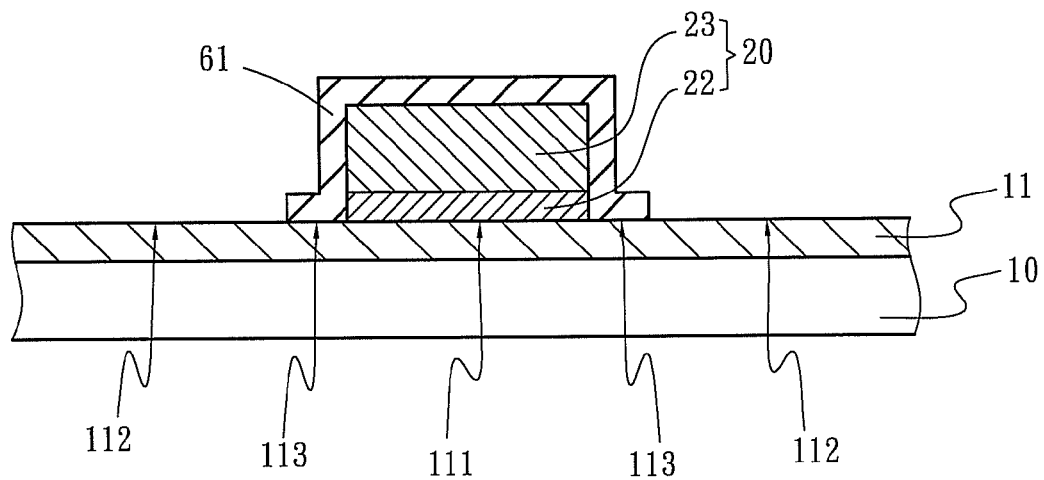
Figure 2D:
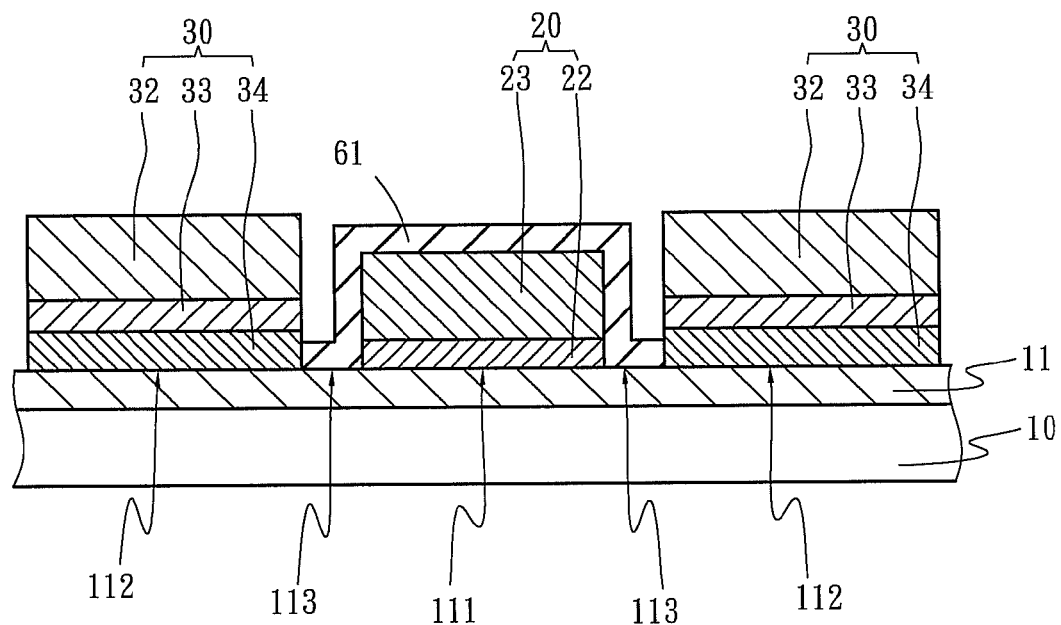

As shown in FIG. 2C and FIG. 2D, form a first mask 61 over the non-growth area 113 and the Schottky diode 20 grown on the first growth area 111. Next, selectively grow a LED 30 on the junction layer 11 with an MOCVD method. Next, remove the first mask 61, whereby only the Schottky diode 20 and the LED 30 respectively remain on the first and second growth areas 111 and 112 of the junction layer 11. In one embodiment, the LED 30 includes a P-type semiconductor layer 32, an N-type semiconductor layer 34, and an active layer 33 arranged between the P-type semiconductor layer 32 and N-type semiconductor layer 34. The LED 30 is made of II-VI group and/or III-V group semiconductor materials. In one embodiment, the P-type semiconductor layer 32 is a multi-layer structure containing periodically stacked P-type gallium nitride and P-type aluminum gallium nitride; the active layer 33 is a quantum-well structure containing gallium nitride and indium gallium nitride; the N-type semiconductor layer 34 is a single-layer structure containing N-type gallium nitride.

Figure 2E:
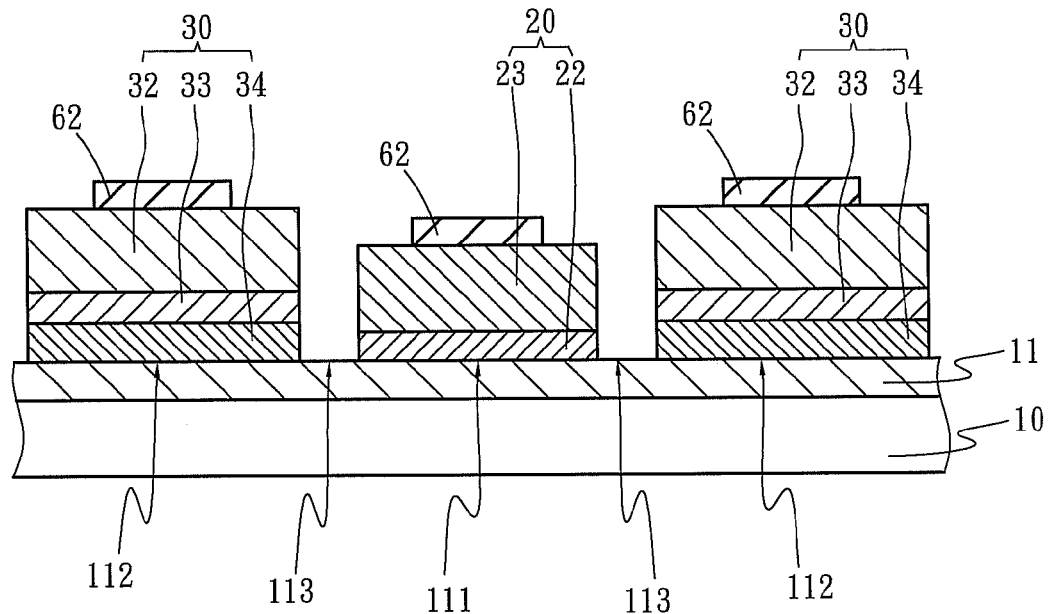
Figure 2F:
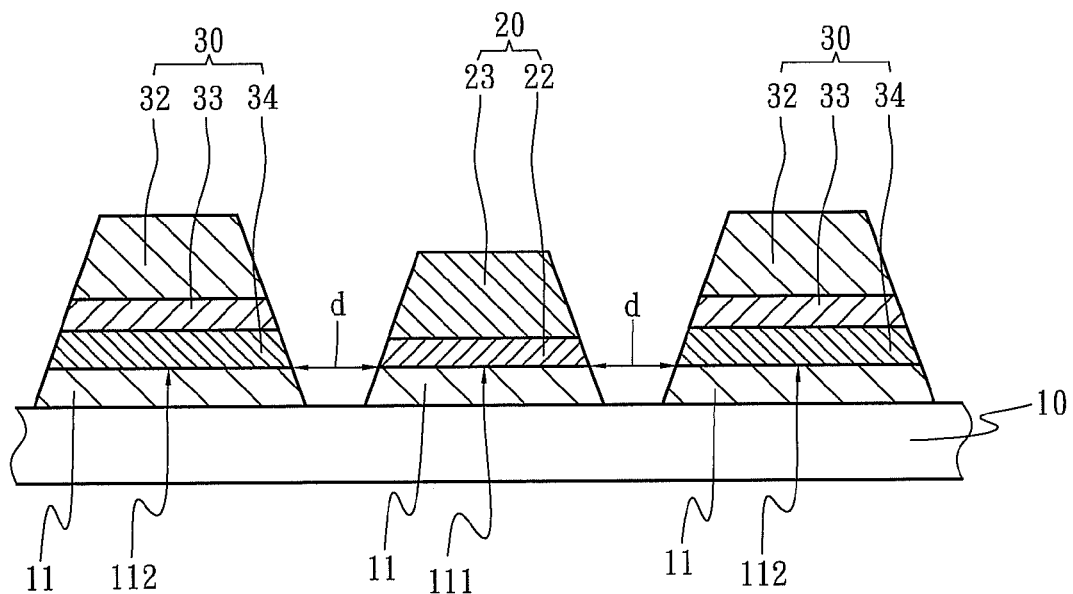

As shown in FIG. 2E, deposit a second mask 62 on the surfaces of the Schottky diode 20 and the LED 30 with the non-growth area 113 being exposed to define the areas for the elements (i.e. the Schottky diode 20 and the LED 30). Next, use a photolithographic technology to etch off the junction layer 11 below the non-growth area 113 and reveal the substrate 10, whereby the diodes are separated by a gap and independent to each other. Next, remove the second mask 62, whereby the first and second growth areas 111 and 112 of the junction layer 11 are separated by a gap d, as shown in FIG. 2F. It should be further explained that the region between two adjacent LEDs (not shown in the drawings) is also etched to reveal the substrate 10 and separate the two adjacent LEDs by another gap.

Figure 2G:
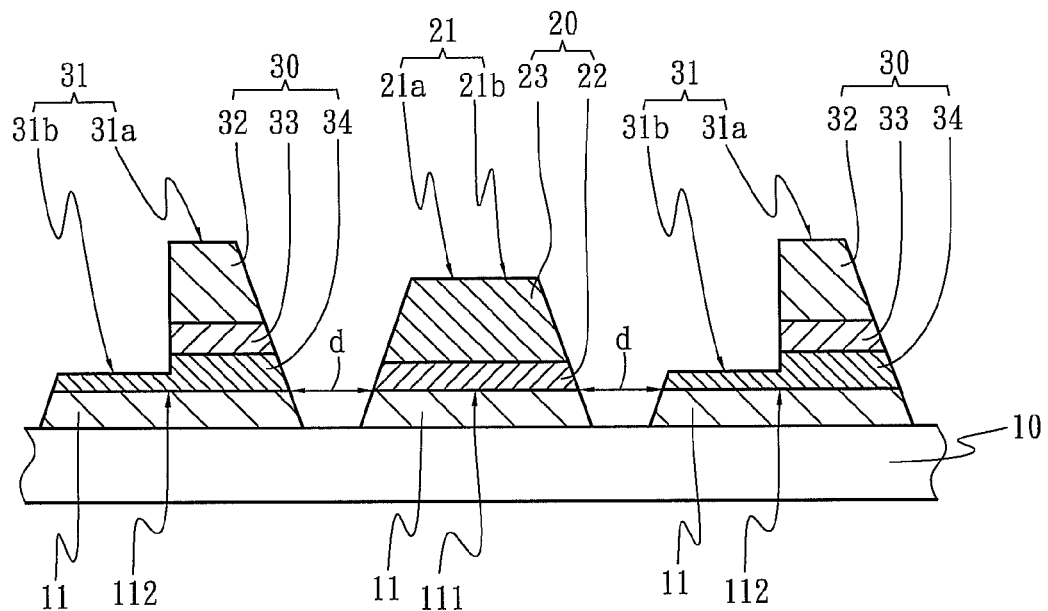
Figure 2H:
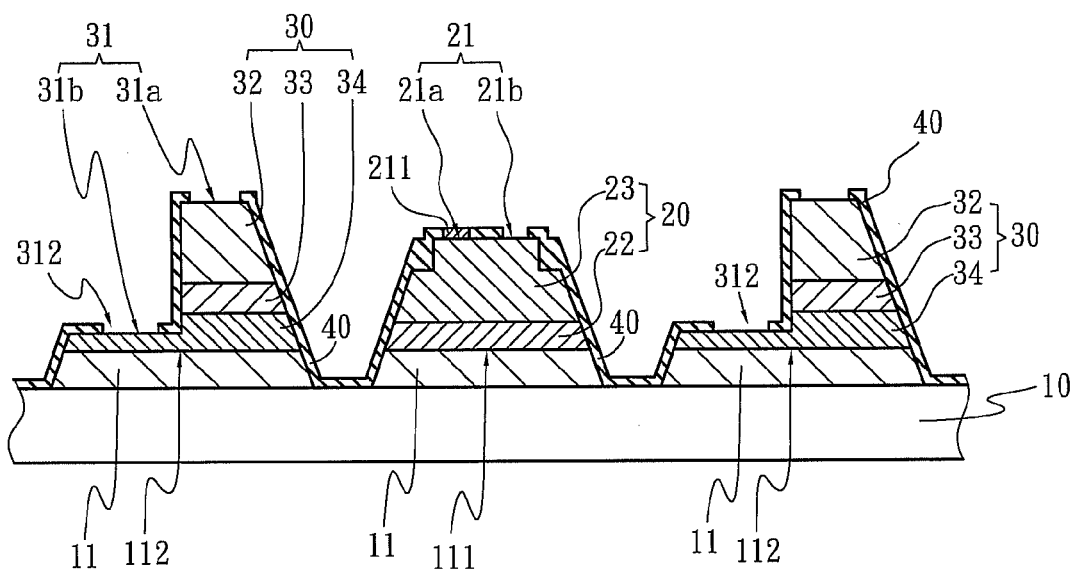

As shown in FIG. 2G and FIG. 2H, etch the LED 30 until the N-type semiconductor layer 34 is exposed. Next, use a photolithographic process to define a second electric connection area 31 on the LED 30. The second electric connection area 31 includes an A connection area 31a on the P-type semiconductor layer 32 and a B connection area 31b on the N-type semiconductor area 34. The Schottky diode 20 has a preset first electric connection area 21. The first electric connection area 21 includes a C connection area 21a and a D connection area 21b separated from the C connection area 21a by a gap. As shown in FIG. 2H, sequentially vapor-deposit titanium, aluminum, titanium and gold on the C connection area 21a, and fast anneal the metals into an alloy having lower ohmic contact resistance to obtain an ohmic electrode 211. Next, form a passivation layer 40 on the Schottky diode 20, the LED 30 and the substrate 10 corresponding to the non-growth area 113. Next, use a photolithographic technology to etch off a portion of the passivation layer 40 but reveal the A connection area 31a, the B connection area 31b, the ohmic electrode 211, and the D connection area 21b, wherein the passivation layer 40 on the B connection area 31b is etched to form a window 312. In one embodiment, the passivation layer 40 is made of silicon dioxide.

Figure 2I:
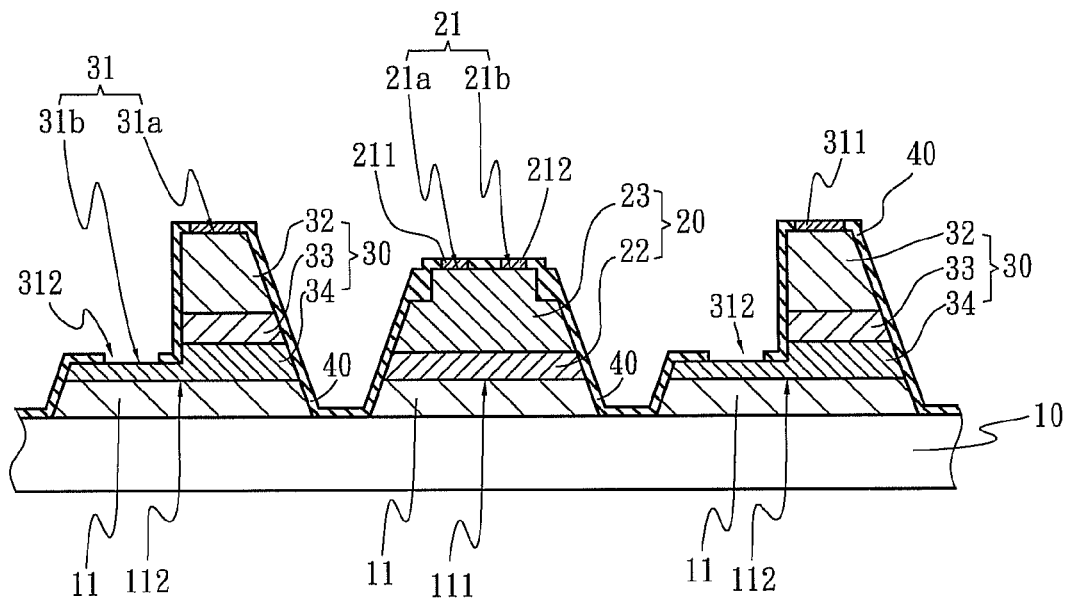

As shown in FIG. 2I, vapor-deposit a conductive ITO (Indium Tin Oxide) film on the A connection area 31a to form a P-type electrode 311. In addition to ITO, the P-type electrode 311 may be made of a nickel-gold alloy, fluorine tin oxide, zinc aluminum oxide, or zinc gallium oxide. Next, vapor-deposit metals (including nickel and gold) on the D connection area 21b to form a Schottky electrode 212. The passivation layer 40, the ohmic electrode 211, the Schottky electrode 212, and the P-type electrode 311 may also be fabricated in a different sequence, wherein the ohmic electrode 211 and the P-type electrode 311 are respectively formed on the C connection area 21a and the A connection area 31a beforehand. Next, grow the passivation layer 40 with the ohmic electrode 211, the P-type electrode 311, the D connection area 21b, and the B connection area 31b being exposed. Alternatively, the ohmic electrode 211 is formed on the C connection area 21a beforehand. Next, grow the passivation layer 40 with the A connection area 31a being exposed. Then, the P-type electrode 311 is formed on the A connection area 31a. And then, use a photolithographic technology to etch off a portion of the passivation layer 40 but reveal the D connection area 21b, and the B connection area 31b.

Figure 2J:
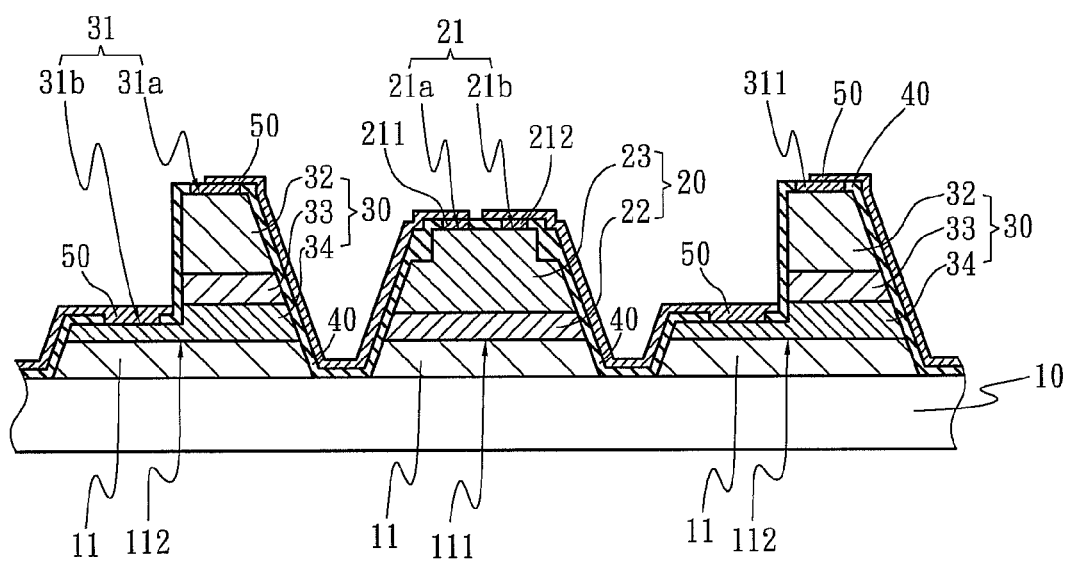
Figure 3A:
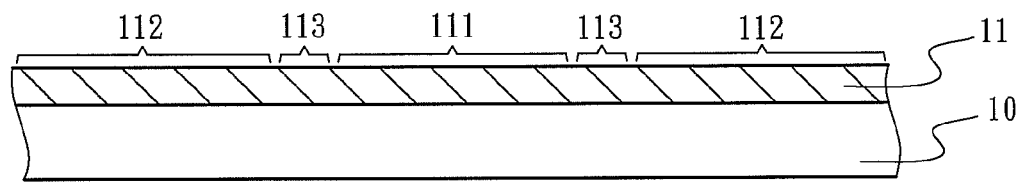
FIGS. 3A-3E schematically show the process to fabricate an integrated AC LED module according to another embodiment of the present invention.
Figure 3B:
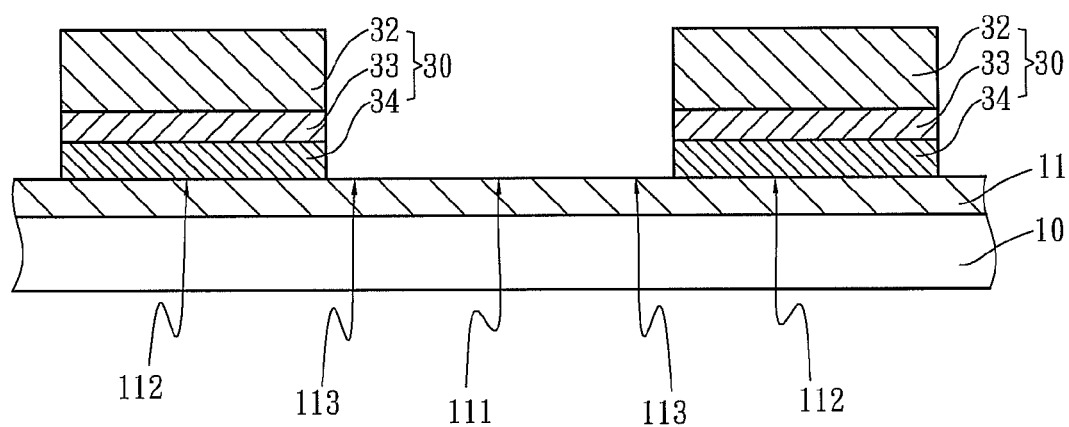
Figure 3C:
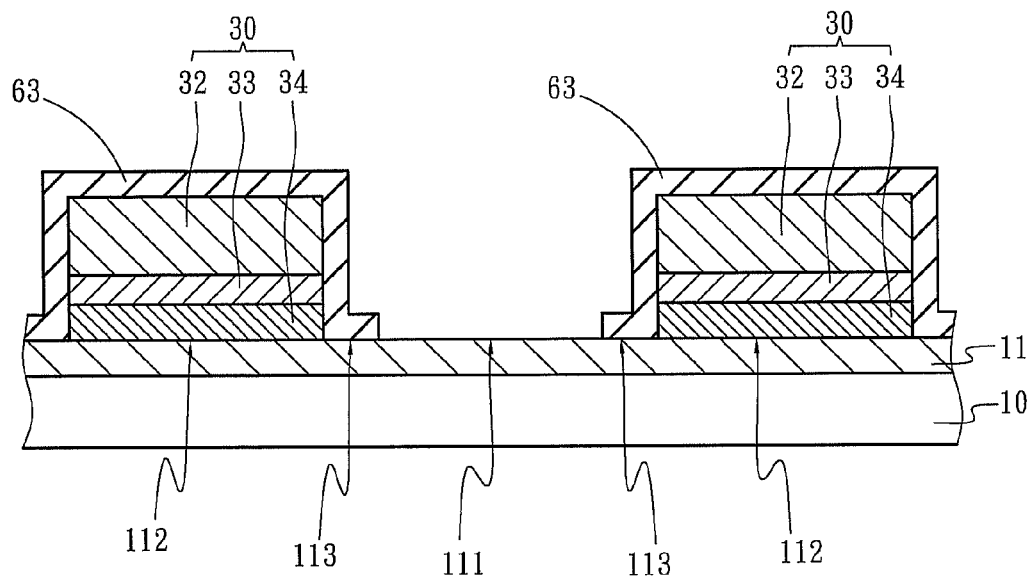
Figure 3D:
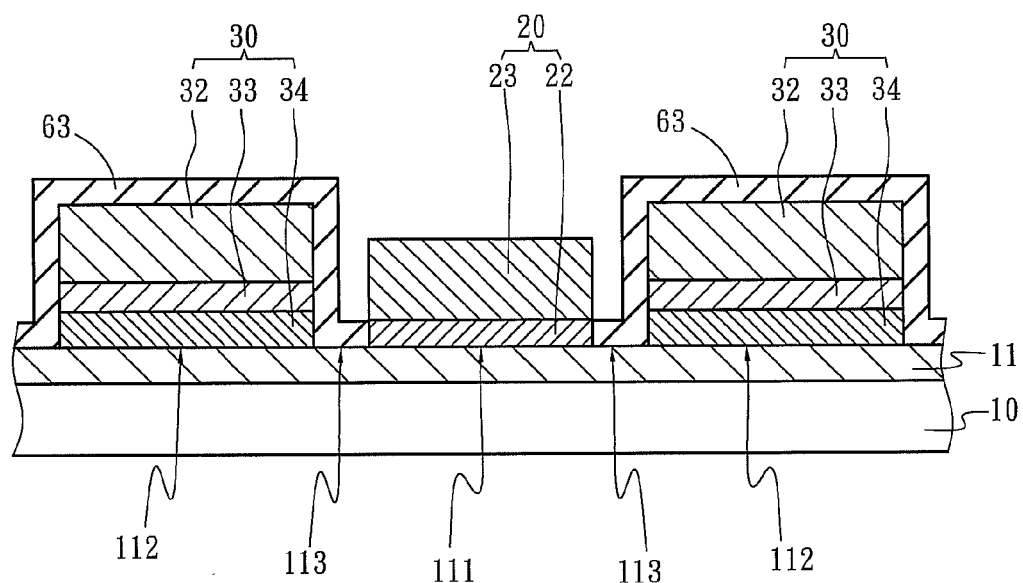
Figure 3E:
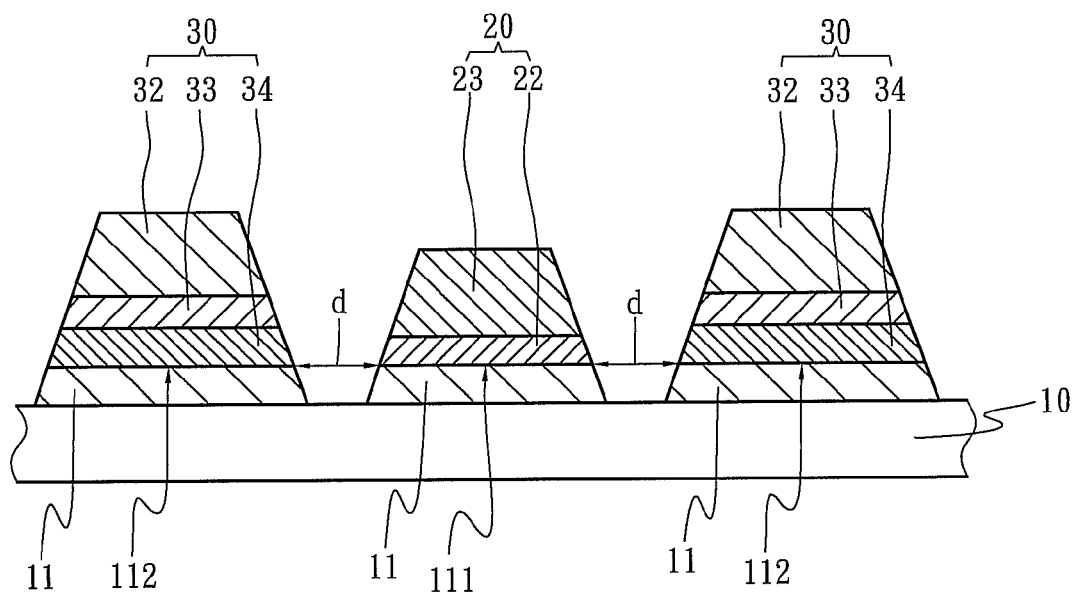

Next, grow the Schottky electrode 212 on the D connection area 21b. Next, use a photolithographic technology to define the metal connection areas for cascading the diodes. As shown in FIG. 2J, vapor-deposit metals (including chromium and gold) to form a metallic layer 50. Thus, the ohmic electrode 211 is electrically connected with the P-type electrode 311 via the metallic layer 50, and the Schottky electrode 212 is electrically connected with the B connection area 31b in the window 312 via the metallic layer 50. Thereby, the Schottky diode 20 and the LED 30 are integrated to form an AC LED module.

In Step S2 described above, the Schottky diode 20 is fabricated in advance, and the LED 30 is then fabricated succeedingly, as shown in FIGS. 2A-2F. Refer to FIGS. 3A-3E sectional views schematically showing the process to fabricate an integrated AC LED module according to another embodiment of the present invention, wherein the LED 30 is fabricated in advance, and then the Schottky diode 20 is fabricated succeedingly. Firstly, grow the LED 30 on the junction layer 11. Next, use a photolithographic technology to etch off the LED 30 on the first growth area 111 and the non-growth area 113 until the junction layer 11 is exposed. Next, form a mask 63 on the non-growth area 113 and the surface of the LED 30 on the second growth area 112. Next, grow the Schottky diode 20. Next, remove the mask 63. Thus, the Schottky diode 20 and the LED 30 are respectively formed on the first growth area 111 and the second growth area 112.

Figure 4:
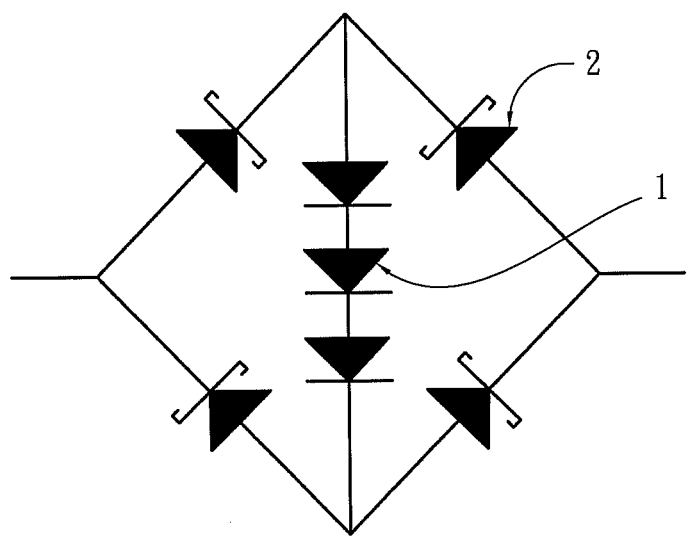
FIG. 4 schematically shows an equivalent circuit according to one embodiment of the present invention.

In the embodiments described above, the Schottky diode 20 and the LED 30 are grown on the substrate 10 and electrically connected by the metallic layer 50 to form a Wheatstone bridge circuit. Refer to FIG. 4 a diagram schematically showing an equivalent circuit according to one embodiment of the present invention. The equivalent circuit comprises a plurality of LEDs 1 and a plurality of Schottky diodes 2, wherein the LEDs 1 and the Schottky diodes 2 are respectively equivalent to the LEDs 30 and the Schottky diodes 20 formed on the substrate 10.

In conclusion, the present invention respectively grows the Schottky diode and the LED on the first growth area and the second growth area, which are separated from each other, to overcome the problem of the conventional technology that etches the overlapped LED and Schottky diode to form separate LED and Schottky diode and thus damages the surface of the LED and degrades the light efficiency of the LED. Further, the present invention uses a metallic layer to electrically connect the Schottky diode with the LED, whereby is reduced the layout area of the device, increased the reliability of the electric connection between elements, and reduced the fabrication cost.

The present invention indeed possesses utility, novelty and non-obviousness and meets the condition for a patent. Thus, the Inventors file the application for a patent. It is appreciated if the patent is approved fast.

The embodiments described above are only to exemplify the present invention but not to limit the scope of the present invention. Any equivalent modification or variation according to the spirit of the present invention is to be also included within the scope of the present invention.

What is claimed is:

1. A method for fabricating an integrated alternating-current light-emitting-diode module, comprising steps:
    providing a substrate and a junction layer on the substrate;
        defining on the junction layer at least one first growth area, at least one second growth area, and at least one non-growth area between the first growth area and the second growth area;
    respectively growing a Schottky diode and a light emitting diode (LED) on the first growth area and the second growth area; respectively defining a first electric connection area and a second electric connection area on surfaces of the Schottky diode and the LED;
    removing the non-growth area on the junction layer until the substrate is exposed, in order to separate the first growth area and the second growth area by a gap;
    forming a passivation layer on the Schottky diode, the LED and the substrate corresponding to the non-growth area, wherein the first electric connection area and the second electric connection area are exposed; and
    forming a metallic layer on the passivation layer, the first electric connection area and the second electric connection area in order to electrically connect the Schottky diode and the LED via the metallic layer.

2. The method for fabricating an integrated alternating-current light-emitting-diode module according to claim 1, wherein the Schottky diode is grown on the first growth area beforehand, and then the LED is grown on the second growth area.

3. The method for fabricating an integrated alternating-current light-emitting-diode module according to claim 1, wherein the LED is fabricated via sequentially growing an N-type semiconductor layer on the second growth area, growing an active layer on the N-type semiconductor layer and growing a P-type semiconductor layer on the active layer.

4. The method for fabricating an integrated alternating-current light-emitting-diode module according to claim 3, wherein the second electric connection area is formed on a surface of the P-type semiconductor, and wherein an ohmic electrode and a P-type electrode are respectively formed on the first electric connection area and the second electric connection area before the metallic layer is formed.

5. The method for fabricating an integrated alternating-current light-emitting-diode module according to claim 3, wherein the second electric connection area is formed on a surface of the N-type semiconductor, and wherein a Schottky electrode is formed on the first electric connection area before the metallic layer is formed.

6. The method for fabricating an integrated alternating-current light-emitting-diode module according to claim 1, wherein the LED is made of a II-VI group or III-V group semiconductor.

7. The method for fabricating an integrated alternating-current light-emitting-diode module according to claim 1, wherein the metallic layer electrically connects a plurality of Schottky diodes and a plurality of LEDs to form an alternating-current (AC) LED module, and wherein the AC LED module is an array of Wheatstone bridge circuits or an array of parallel inverse cascade circuits.

8. The method for fabricating an integrated alternating-current light-emitting-diode module according to claim 1, wherein the P-type electrode is made of a material selected from a group consisting of nickel-gold alloys, indium tin oxide, fluorine tin oxide, zinc aluminum oxide, and zinc gallium oxide.

9. The method for fabricating an integrated alternating-current light-emitting-diode module according to claim 1, wherein the Schottky diode includes a buffer layer contacting the junction layer.

10. The method for fabricating an integrated alternating-current light-emitting-diode module according to claim 9, wherein the buffer layer is made of a material selected from a group consisting of gallium nitride, aluminum nitride, indium nitride, and combinations thereof.

11. The method for fabricating an integrated alternating-current light-emitting-diode module according to claim 1, wherein the Schottky diode includes an active layer contacting the buffer layer.

12. The method for fabricating an integrated alternating-current light-emitting-diode module according to claim 11, wherein the active layer is made of a material selected from a group consisting of gallium nitride, aluminum indium gallium nitride, and magnesium zinc oxide.

13. The method for fabricating an integrated alternating-current light-emitting-diode module according to claim 1, wherein the substrate is made of a material selected from a group consisting of sapphire, silicon, silicon carbide, and gallium nitride.

* * * * *